(12) United States Patent
Liu et al.

(10) Patent No.: US 7,775,262 B2
(45) Date of Patent: Aug. 17, 2010

(54) LOOP-TYPE HEAT EXCHANGE DEVICE

(75) Inventors: Tay-Jian Liu, Guangdong (CN);
Chao-Nien Tung, Guangdong (CN);
Chuen-Shu Hou, Guangdong (CN);
Chih-Peng Lee, Gaungdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 1200 days.

(21) Appl. No.: 11/308,072

(22) Filed: Mar. 5, 2006

(65) Prior Publication Data
US 2006/0272798 A1 Dec. 7, 2006

(30) Foreign Application Priority Data
Jun. 3, 2005 (TW) .............................. 94118402 A (51) Int. Cl.
*F28D 15/00* (2006.01)
*H05K 7/20* (2006.01)
(52) U.S. Cl. ...................... 165/104.26; 165/104.33; 165/104.21
(58) Field of Classification Search ............ 165/104.21, 165/104.26, 104.33, 108, 174, 176; 361/700, 361/704; 257/715
See application file for complete search history.

(56) References Cited

U.S. PATENT DOCUMENTS

| | | | | |
|---|---|---|---|---|
| 2,156,053 A | * | 4/1939 | Fiene | 237/9 R |
| 6,119,767 A | * | 9/2000 | Kadota et al. | 165/104.33 |
| 6,227,287 B1 | * | 5/2001 | Tanaka et al. | 165/104.26 |
| 6,418,017 B1 | * | 7/2002 | Patel et al. | 361/700 |
| 6,804,117 B2 | * | 10/2004 | Phillips et al. | 361/700 |
| 6,840,310 B2 | * | 1/2005 | Tonosaki et al. | 165/104.21 |
| 7,007,746 B2 | * | 3/2006 | Wu et al. | 165/104.26 |
| 2002/0157813 A1 | * | 10/2002 | Cho et al. | 165/104.26 |
| 2003/0010477 A1 | * | 1/2003 | Khrustalev et al. | 165/104.33 |
| 2003/0051859 A1 | | 3/2003 | Chesser | |
| 2005/0006070 A1 | * | 1/2005 | Kamiyama et al. | 165/140 |
| 2005/0056403 A1 | * | 3/2005 | Norlin et al. | 165/104.33 |
| 2005/0082158 A1 | | 4/2005 | Wenger | |

FOREIGN PATENT DOCUMENTS

CN 2569345 Y 8/2003
JP 62-131199 6/1987

* cited by examiner

*Primary Examiner*—Tho V Duong
(74) *Attorney, Agent, or Firm*—Winston Hsu (57) ABSTRACT

A loop-type heat exchange device (10) includes an evaporator (20), a vapor conduit (30), a condenser (50) and a liquid conduit (70). The evaporator contains therein a working fluid. The working fluid turns into vapor in the evaporator upon receiving heat from a heat-generating component. The condenser includes a housing member (52), a plurality of tube members (53) being in fluid communication with the housing member, and a fin member (54) maintained in thermal contact with the tube members. The vapor conduit and the liquid conduit are each connected between the evaporator and the condenser. The vapor conduit conveys the vapor generated in the evaporator to the tube members of the condenser. The vapor turns into condensate in the tube members upon releasing the heat to the fin member. The condensate is conveyed back to the evaporator by the liquid conduit.

19 Claims, 11 Drawing Sheets

LOOP-TYPE HEAT EXCHANGE DEVICE

FIELD OF THE INVENTION

The present invention relates generally to an apparatus for dissipation of heat from heat-generating components, and more particularly to a loop-type heat exchange device suitable for removing heat from heat-generating electronic components.

DESCRIPTION OF RELATED ART

As progress continues developing in electronic industries, electronic components such as integrated circuit chips are made to have more powerful functions while maintaining an unchanged size or even a smaller size. As a result, the amount of heat generated by these electronic components during their normal operations is commensurately increased, which in turn will adversely affect their workability and stability. It is well known that cooling devices are commonly used to remove heat from heat-generating components. However, currently well-known cooling devices such as heat sinks plus electric fans are no longer qualified or desirable for removing the heat from these electronic components due to their low heat removal capacity. Conventionally, increasing the rotation speed of the cooling fan and increasing the size of the heat sink are two approaches commonly used to improve the heat dissipating performance of the cooling device involved. However, if the rotation speed of the cooling fan is increased, problems such as large noise will inevitably be raised. On the other hand, by increasing the size of the heat sink, it will make the cooling device bulky, which contravenes the current trend towards miniaturization.

Currently, an advantageous mechanism for more effectively removing the heat from these electronic components and overcoming the aforementioned disadvantages is adopted, which is related to use of heat pipe technology. Heat pipes are an effective heat transfer means due to their low thermal resistance. A heat pipe is usually a vacuum casing containing therein a working fluid. Preferably, a wick structure is provided inside the heat pipe, lining an inner wall of the casing. The heat pipe has an evaporating section for receiving heat from a heat-generating component and a condensing section for releasing the heat absorbed by the evaporating section. When the heat is inputted into the heat pipe via its evaporating section, the working fluid contained therein absorbs the heat and turns into vapor. Due to the difference of vapor pressure between the two sections of the heat pipe, the generated vapor moves, with the heat being carried, towards the condensing section where the vapor is condensed into condensate after releasing the heat into ambient environment by, for example, fins thermally contacting the condensing section. Due to the difference of capillary pressure developed by the wick structure between the two sections, the condensate is then drawn back by the wick structure to the evaporating section where it is again available for evaporation.

In the heat pipe, however, there still exists a fatal drawback awaited to be overcome. The movement of the vapor is countercurrent to that of the condensate within the casing of the heat pipe. The movement of the vapor will, to a certain extent, produce a resistance to the flow of the condensate due to an interaction between the vapor and the condensate. This negative effect will lower down the speed of the condensate in supplying to the evaporating section of the heat pipe. If the condensate is not timely sent back to the evaporating section, the heat pipe will suffer a dry-out problem at that section.

Figure 11:
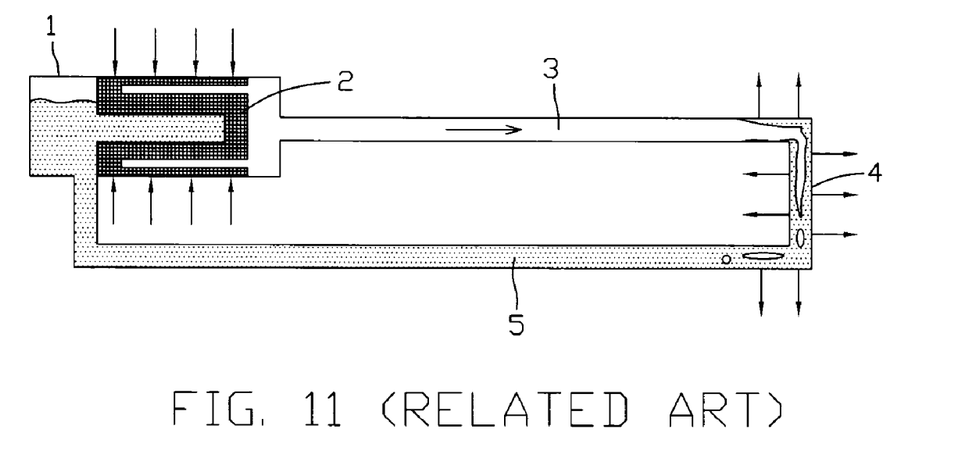
FIG. 11 is a schematic view showing a loop-type heat exchange device in accordance with the conventional art.

In order to overcome the foregoing drawback of the heat pipe, a loop-type heat exchange device has been proposed, as illustrated in FIG. 11. The heat exchange device includes an evaporator 1 in which a wick structure 2 saturated with a working fluid is provided, a vapor conduit 3, a condenser 4 and a liquid conduit 5. The working fluid in the evaporator 1 evaporates into vapor after absorbing heat from a heat source, and the generated vapor flows, via the vapor conduit 3, to the condenser 4 where the vapor turns into condensate after releasing its latent heat of evaporation. The condensate then returns back to the evaporator 1 via the liquid conduit 5, thus forming a heat transfer loop. The loop-type heat exchange device offers an advantage that the vapor and the condensate move along the heat transfer loop separately and do not interfere with each other.

In practice, the condenser 4 of the heat exchange device generally takes the form of metal fins stacked along a pipe section interconnecting the vapor conduit 3 and the liquid conduit 5. Since the pipe section has a small contacting surface area (i.e., the circumferential surface area of the pipe section) with the metal fins, this results in large interfacial resistance and spreading resistance between the pipe section and the metal fins. As a result, the heat carried by the vapor cannot be timely and effectively transferred from the pipe section to the metal fins for dissipation and the heat removal capacity of the heat exchange device as a whole is limited. Furthermore, in the heat exchange device as illustrated in FIG. 11, no effective mechanism is provided to maintain the unidirectional movement of the working liquid along the heat transfer loop. Frequently, a portion of the vapor generated in the evaporator 1 moves backwards towards and enters into the liquid conduit 5. This portion of vapor flowing backwards will produce significant resistance to the condensate being conveyed from the condenser 4 to the evaporator 1 along the liquid conduit 5.

Therefore, it is desirable to provide a loop-type heat exchange device which overcomes the foregoing disadvantages.

SUMMARY OF INVENTION

The present invention relates to a loop-type heat exchange device for removing heat from a heat-generating component. The heat exchange device includes an evaporator, a condenser, a vapor conduit and a liquid conduit. The evaporator contains therein a working fluid. The working fluid turns into vapor in the evaporator upon receiving the heat from the heat-generating component. The condenser includes a first housing member, a plurality of tube members being in fluid communication with the first housing member, and a fin member maintained in thermal contact with the tube members. The vapor conduit and the liquid conduit are each connected between the evaporator and the condenser. The vapor conduit conveys the vapor generated in the evaporator to the tube members of the condenser. The vapor turns into condensate in the tube members upon releasing the heat to the fin member. The condensate is conveyed back to the evaporator by the liquid conduit.

As further improvements, first wick structure and second wick structure are provided in the evaporator and in the liquid conduit, respectively. The evaporator has a first region for receiving the heat from the heat-generating component and a second region accommodating the first wick structure. The vapor conduit and the liquid conduit communicate with the first and second regions, respectively. A plurality of metal fins extends from an outer surface of the evaporator and is located in alignment with the second region. The evaporator has an outer wall for contacting the heat-generating component. The outer wall has first section and second section corresponding to the first and second regions of the evaporator, respectively. The first section is thicker than the second section.

Other advantages and novel features of the present invention will become more apparent from the following detailed description of preferred embodiment when taken in conjunction with the accompanying drawings, in which:

DETAILED DESCRIPTION

Figure 1:
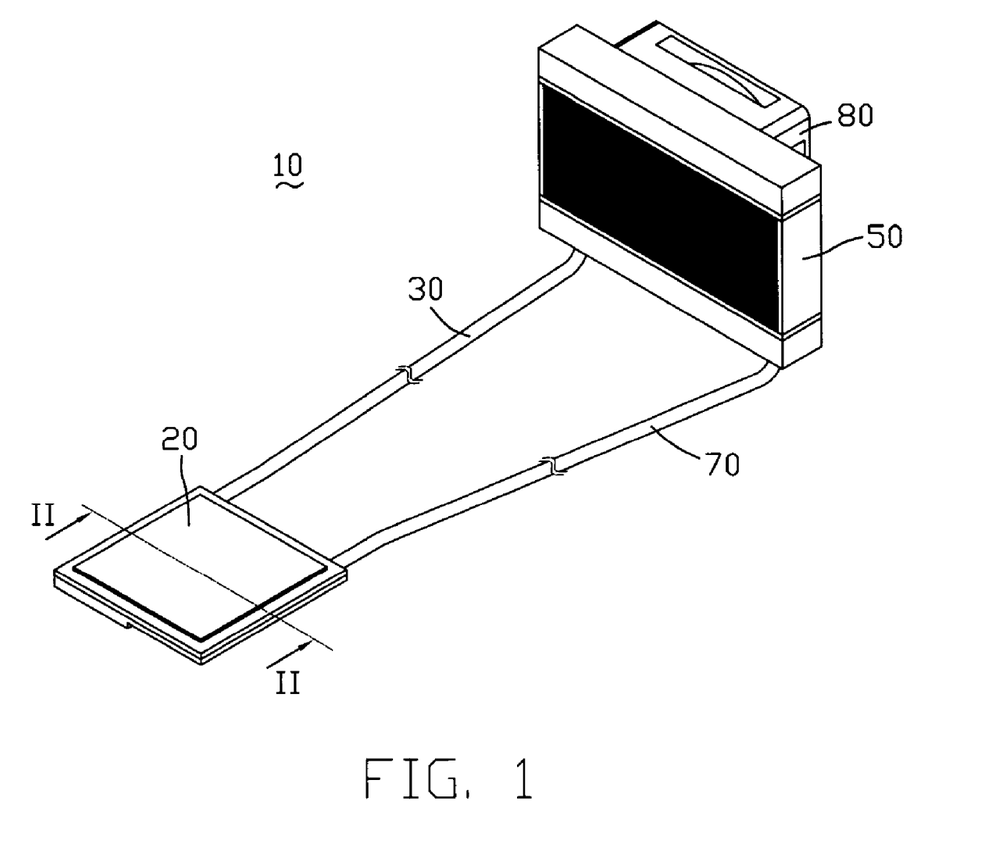
FIG. 1 is an isometric view of a loop-type heat exchange device in accordance with a first embodiment of the present invention.

FIG. 1 illustrates a loop-type heat exchange device 10 in accordance with a first embodiment of the present invention. The heat exchange device 10 includes an evaporator 20, a vapor conduit 30, a condenser 50, a liquid conduit 70 and an electric fan 80. The evaporator 20 preferably is made of two separable portions connected together, as will be discussed in more detail later. Two ends of each of the vapor and liquid conduits 30, 70 are connected to the evaporator 20 and the condenser 50, respectively. The vapor and liquid conduits 30, 70 preferably are made of flexible metal or non-metal materials so that they could be bent or flattened easily in order for the heat exchange device 10 to be applicable in certain circumstances.

The evaporator 20 contains therein a working fluid such as water or alcohol (not shown). As heat from a heat source (not shown) such as a central processing unit (CPU) of a computer is applied to the evaporator 20, the working fluid contained therein evaporates into vapor after absorbing the heat. Then, the generated vapor flows, via the vapor conduit 30, to the condenser 50 where the vapor releases its latent heat of evaporation to the condenser 50 and accordingly turns into condensate. The heat then is dissipated into the ambient environment by the condenser 50 and the electric fan 80. The condensate resulted from the vapor at the condenser 50 returns back, via the liquid conduit 70, to the evaporator 20 where it is again available for evaporation. In the heat exchange device 10, the movement of the working fluid forms a heat transfer loop whereby the heat of the CPU is effectively removed away. The movements of the vapor and the condensate are carried out separately in the respective vapor and liquid conduits 30, 70.

Figure 2:
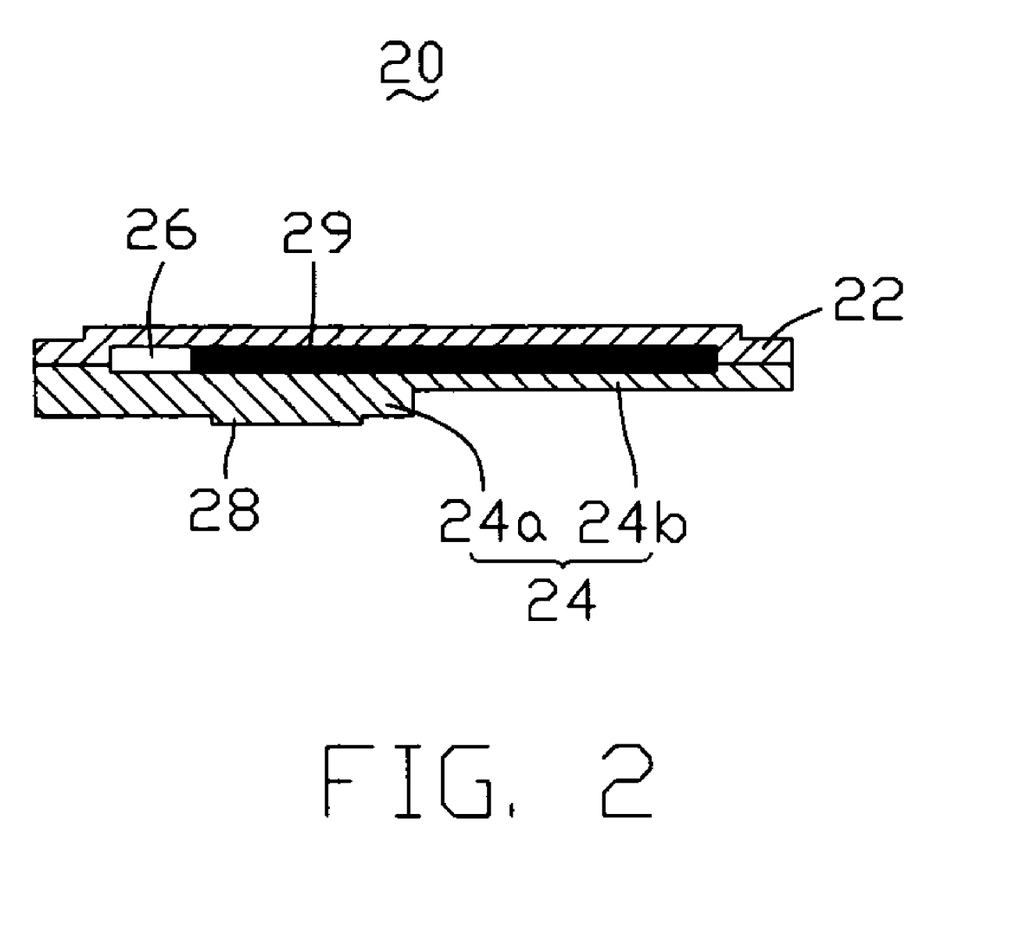
FIG. 2 is a cross-sectional view of an evaporator of the heat exchange device of FIG. 1, taken along the line II-II thereof.
Figure 3:
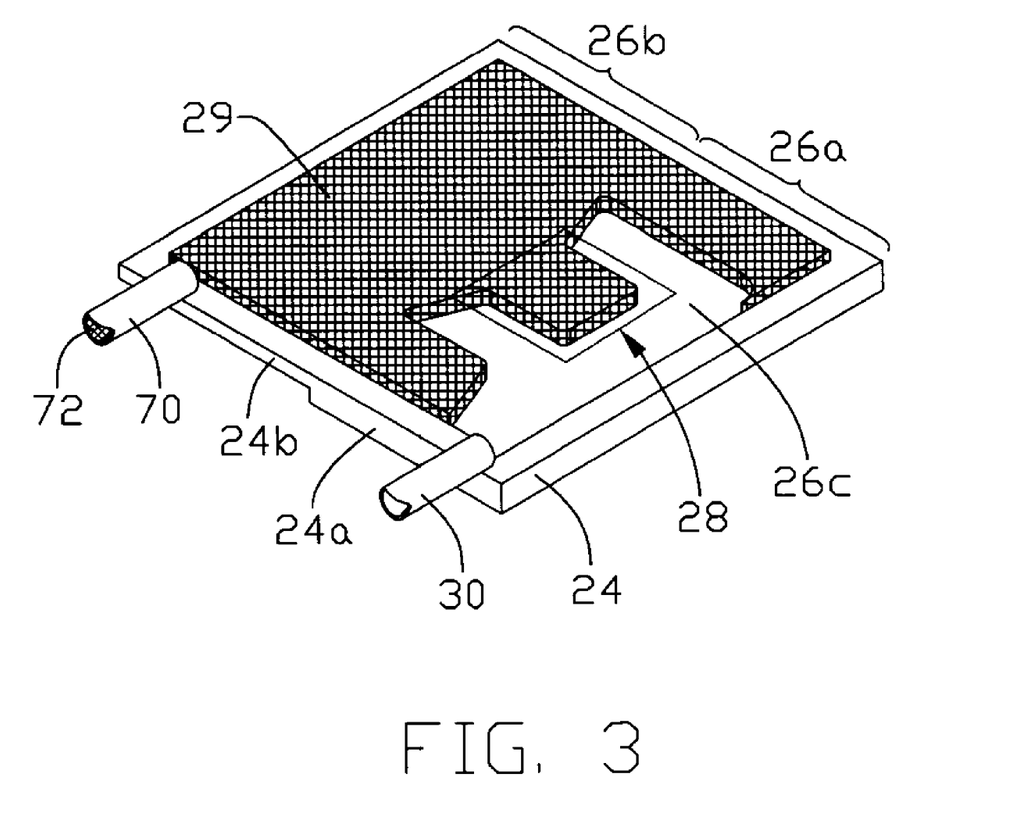
FIG. 3 is an isometric view of the evaporator of the heat exchange device of FIG. 1, with a top cover thereof being removed.

With reference to FIGS. 2-3, the evaporator 20 has a plate-type configuration, which includes a top cover 22 and a bottom cover 24. The top and bottom covers 22, 24 cooperate with each other to define a chamber 26 inside the evaporator 20. The bottom cover 24 includes a first, thicker section 24a and a second, thinner section 24b integrally extending from one side of the first section 24a. The first section 24a projects downwardly to an extent below the second section 24b with a step (not labeled) formed between the first and second sections 24a, 24b. A protrusion 28 is formed by extending further downwardly from a substantially middle portion of the first section 24a of the bottom cover 24 for contacting the CPU. A first wick structure 29 is arranged inside the evaporator 20. The working fluid contained in the evaporator is saturated in the first wick structure 29. The first wick structure 29 defines therein a plurality of micro-channels (not labeled) for storage of and providing passageways for the working fluid. The first wick structure 29 is preferably in the form of sintered powders or a screen mesh made of flexible metal wires or organic fibers.

The chamber 26 of the evaporator 20 includes two major regions, i.e., an evaporating region 26a and an adjacent liquid micro-channel region 26b, corresponding to the first and second sections 24a, 24b of the bottom cover 24 of the evaporator 20, respectively. The micro-channel region 26b is fully filled with the first wick structure 29. Also, a portion of the first wick structure 29 extends from the micro-channel region 26b into a middle part of the evaporating region 26a. This portion of the first wick structure 29 has a size substantially equal to that of the protrusion 28 of the bottom cover 24, and is fittingly located just above and covers the protrusion 28. Additionally, another portion of the first wick structure 29 extends from the micro-channel region 26b into front and rear sides of the evaporating region 26a, as viewed from FIG. 3. As a result, the first wick structure 29 spans across both the micro-channel region 26b and the evaporating region 26a of the chamber 26 of the evaporator 20. The remaining part of the evaporating region 26a not filled with the first wick structure 29 is provided as a vapor-gathering sub-region 26c for accommodating the generated vapor in the evaporator 20. The vapor and liquid conduits 30, 70 are connected to the evaporating region 26a and the micro-channel region 26b, respectively. The vapor-gathering sub-region 26c is communicated with the vapor conduit 30 so as to enable the generated vapor to leave the evaporator 20 and go into the vapor conduit 30 smoothly.

In order to bring the condensate from the condenser 50 back to the evaporator 20 timely, a second wick structure 72 is arranged against an inner surface of the liquid conduit 70, as shown in FIG. 3. The second wick structure 72 may be fine grooves integrally formed at the inner surface of the liquid conduit 70, screen mesh or bundles of fiber inserted into the liquid conduit 70, or sintered powders combined to the inner surface of the liquid conduit 70.

Figure 4:
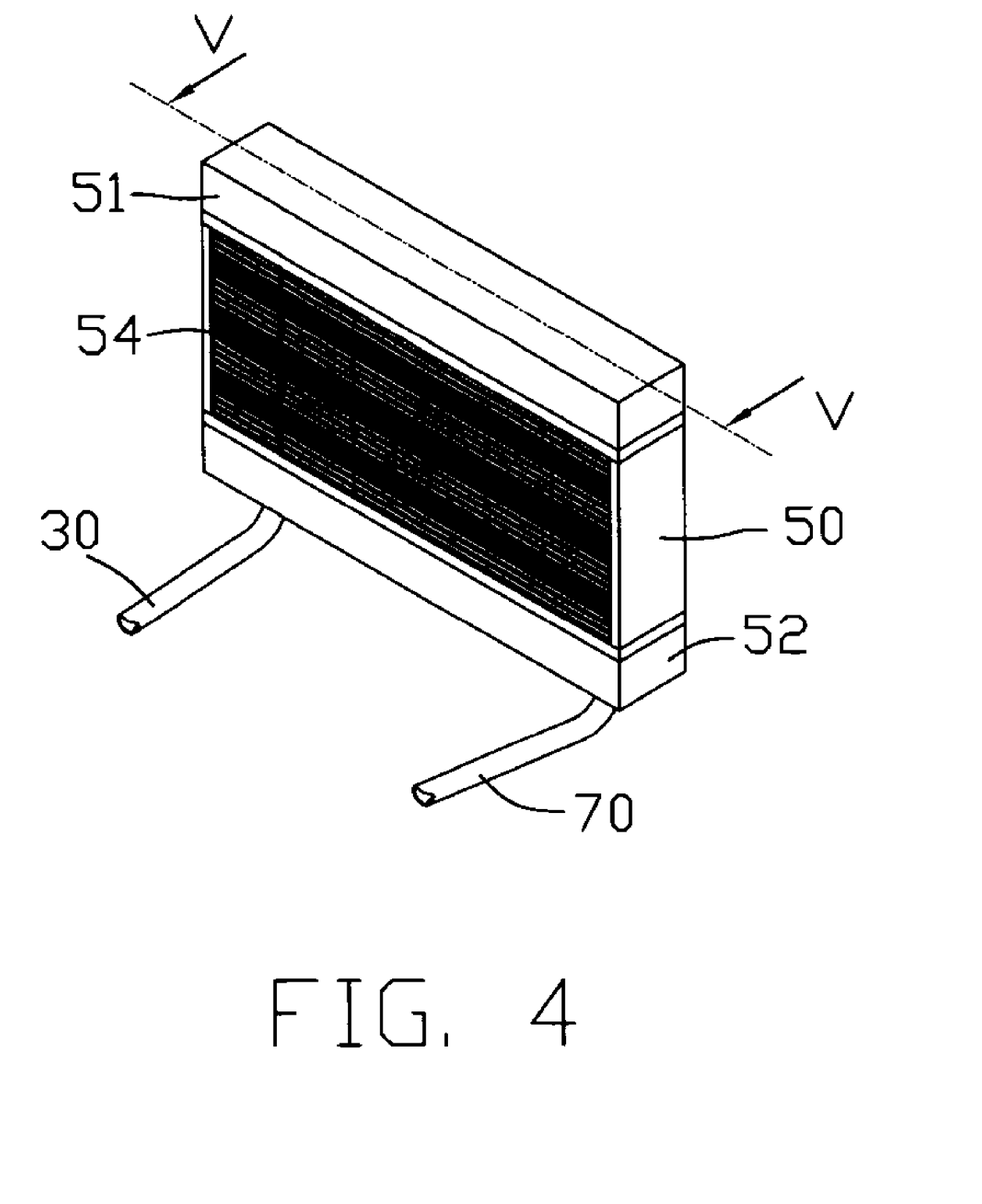
FIG. 4 is an isometric view of a condenser of the heat exchange device of FIG. 1.
Figure 5:
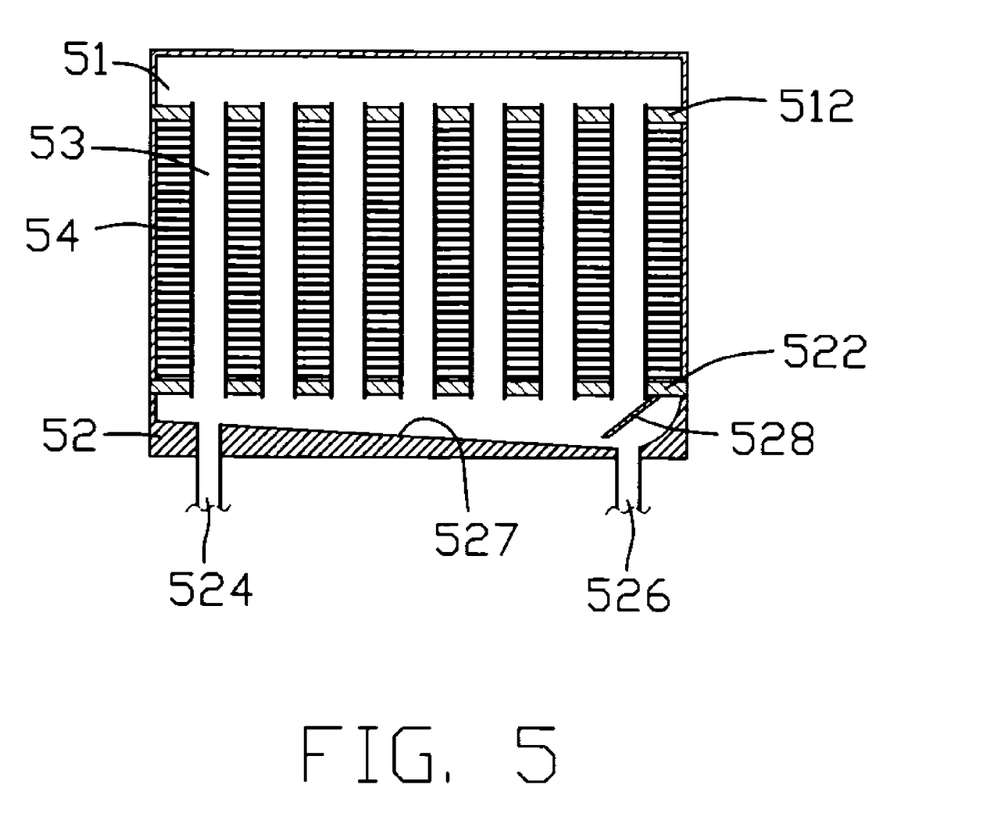
FIG. 5 is a cross-sectional view of the condenser of FIG. 4, taken along line V-V thereof.

Referring now to FIGS. 4-5, the condenser 50 includes top and bottom housings 51, 52 and a plurality of condensing tubes 53 along which a plurality of metal fins 54 is stacked. Each of the top and bottom housings 51, 52 has an elongated, box-like structure. These condensing tubes 53 are located between the top and bottom housings 51, 52 and are positioned in parallel with each other. Two ends of each of these condensing tubes 53 are communicated with the top and bottom housings 51, 52, respectively. Specifically, a bottom wall 512 of the top housing 51 and a top wall 522 of the bottom housing 52 each define therein a plurality of holes (not labeled). Top and bottom ends of these condensing tubes 53 are fixedly and hermetically positioned in these holes defined in the walls 512, 522. As presenting a large heat dissipating surface area, the metal fins 54 are made of highly thermally conductive material such as copper or aluminum and are maintained in intimate thermal contact with a circumferential surface of each of the condensing tubes 53. The bottom housing 52 has an inlet 524 and an outlet 526, both of which are defined in a bottom wall (not labeled) of the bottom housing 52. The inlet 524 and outlet 526 are located at opposite sides of the bottom wall and are used to connect with the vapor and liquid conduits 30, 70, respectively.

As the vapor generated in the evaporator 20 enters into the bottom housing 52 of the condenser 50 through the inlet 524, the vapor moves freely into the condensing tubes 53 where the vapor releases the heat carried thereby to the metal fins 54 contacting the condensing tubes 53. With these condensing tubes 53 and metal fins 54, the condenser 50 has a large heat removal capacity and therefore the vapor can be effectively cooled at the condenser 50. After the vapor releases the heat in the condensing tubes 53, it turns into the condensate. The condensate then flows towards the bottom housing 52. Thereafter, the condensate gathered in the bottom housing 52 flows through the outlet 526 into the liquid conduit 70 through which the condensate is brought back to the evaporator 20. As shown in FIG. 4, the condenser 50 is preferably positioned in an upright position with the condensing tubes 53 located perpendicularly to the liquid conduit 70 so that the condensate condensed in the condensing tubes 53 can move towards the bottom housing 52 and accordingly the liquid conduit 70 rapidly and smoothly by resorting to the weight of the condensate. In order to cause the condensate contained in the bottom housing 52 to enter into the liquid conduit 70 more rapidly and smoothly, the bottom wall of the bottom housing 52 has a slanted inner surface 527 declining from the inlet 524 towards the outlet 526 and has the lowest level at the outlet 526. On the other hand, in order to prevent the vapor entering into the bottom housing 52 from directly entering into the liquid conduit 70 through the outlet 526 without having been condensed in the condenser 50, a baffle 528 is placed above the outlet 526 in such a manner that it blocks a vast majority of the vapor in the bottom housing 52 to directly enter into the liquid conduit 70 but do not block the condensate in the bottom housing 52 to enter into the liquid conduit 70.

In operation, the protrusion 28 of the bottom cover 24 of the evaporator 20 is maintained in thermal contact with the CPU. Preferably, a layer of thermal interface material is applied over their contacting surfaces in order to reduce thermal resistance. The heat generated by the heat source is firstly transferred to the first section 24a of the bottom cover 24 and then to the evaporating region 26a of the chamber 26 of the evaporator 20 to cause the working fluid contained in that region to evaporate into the vapor after absorbing the heat from the CPU. Due to the difference of vapor pressure between the evaporator 20 and the condenser 50, the generated vapor moves towards the condenser 50 via the vapor conduit 30. The vapor conduit 30 may also have a larger diameter than the liquid conduit 70 so as to enable the generated vapor in the evaporator 20 to move towards the condenser 50 smoothly. After the vapor releases its latent heat in the condenser 50 and turns into the condensate, the condensate is then rapidly and timely drawn back to the micro-channel region 26b of the chamber 26 of the evaporator 20 via the liquid conduit 70 under the capillary forces of the second and first wick structures 72, 29 as respectively provided in the liquid conduit 70 and the evaporator 20, thereby preventing an excessive amount of the condensate from accumulating in the condenser 50 and meanwhile avoiding the potential dry-out problem occurring at the evaporator 20. Since an inventory of working fluid in the evaporating region 26a is reduced due to the evaporation in that region, the condensate returned to the micro-channel region 26b is subsequently drawn to the evaporating region 26a for being available again for evaporation as a result of the capillary force of the first wick structure 29. This cycle of the working fluid effectively takes heat away from the CPU.

In the present heat exchange device 10, the two-section design of the bottom cover 24 with different thicknesses is aimed to reduce an amount of the heat of the CPU to be conducted from the first section 24a to the second section 24b and finally to the micro-channel region 26b of the evaporator 20. Since the first section 24a has a larger thickness than the second section 24b, the heat conducted laterally from the first section 24a towards the second section 24b is reduced in comparison with a bottom cover with a uniform thickness. Accordingly, the heat transferred to the micro-channel region 26b of the evaporator 20 from the bottom cover 24 is also effectively reduced, the condensate in the micro-channel region 26b is less likely to be heated directly in that region and excessive vapor is thus prevented from being formed and accumulated in the micro-channel region 26b.

Figure 6:
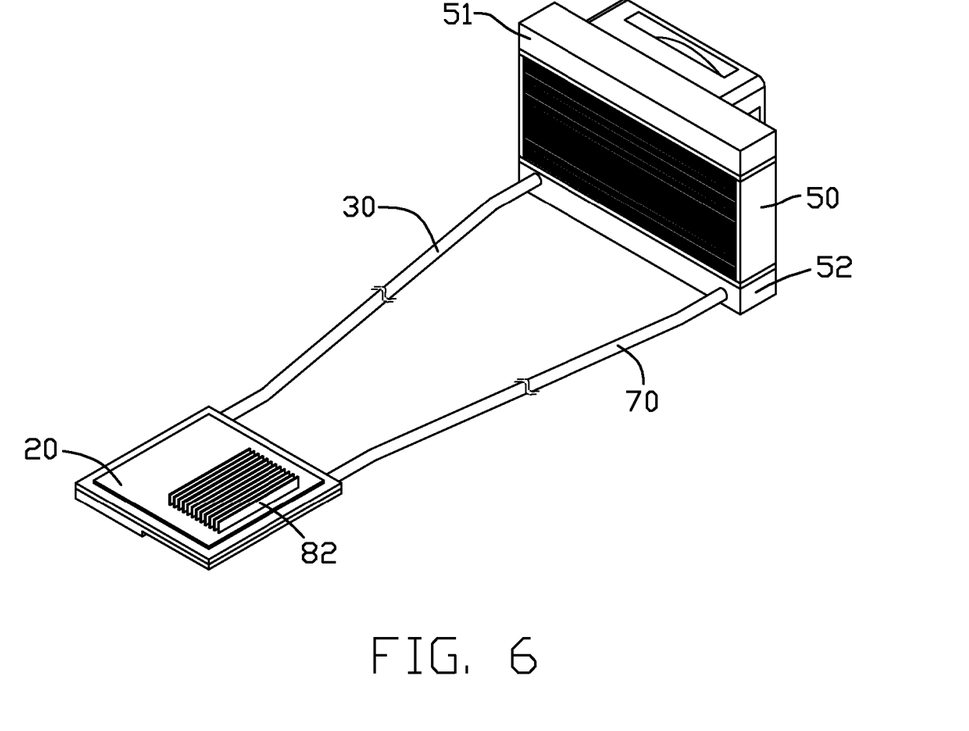
FIG. 6 is an isometric view of a loop-type heat exchange device in accordance with a second embodiment of the present invention.

FIG. 6 shows a second embodiment of the present invention, in which a plurality of metal fins 82 is provided on an outer surface of the evaporator 20. The metal fins 82 are aligned with the micro-channel region 26b of the chamber 26 of the evaporator 20. The vapor and liquid conduits 30, 70 are connected to a sidewall (not labeled) of the bottom housing 52 of the condenser 50. The other structure of this embodiment is the same as that of the first embodiment described above, and its description is omitted. In this embodiment, the metal fins 82 are provided as a cooling device to lower the temperature of the micro-channel region 26b and at the same time to prevent vapor from being formed and accumulated in that region. Since the micro-channel region 26b is connected with the adjacent evaporating region 26a, a portion of the vapor generated in the evaporating region 26a will "creep" from the evaporating region 26a into the micro-channel region 26b due to a large vapor pressure in the vapor-gathering sub-region 26c. Additionally, the temperature in the micro-channel region 26b will also gradually increase, subject to a relatively high temperature and a flow of the vapor in the evaporating region 26a. The metal fins 82 are applied to directly condense the vapor entering into the micro-channel region 26b and simultaneously to dissipate the heat transferred to the micro-channel region 26b from the adjacent evaporating region 26a or the second, thinner section 24b of the bottom cover 24. Thus, due to the presence of the metal fins 82, the vapor potentially to be formed and accumulated in the micro-channel region 26b is greatly reduced.

Figure 7:
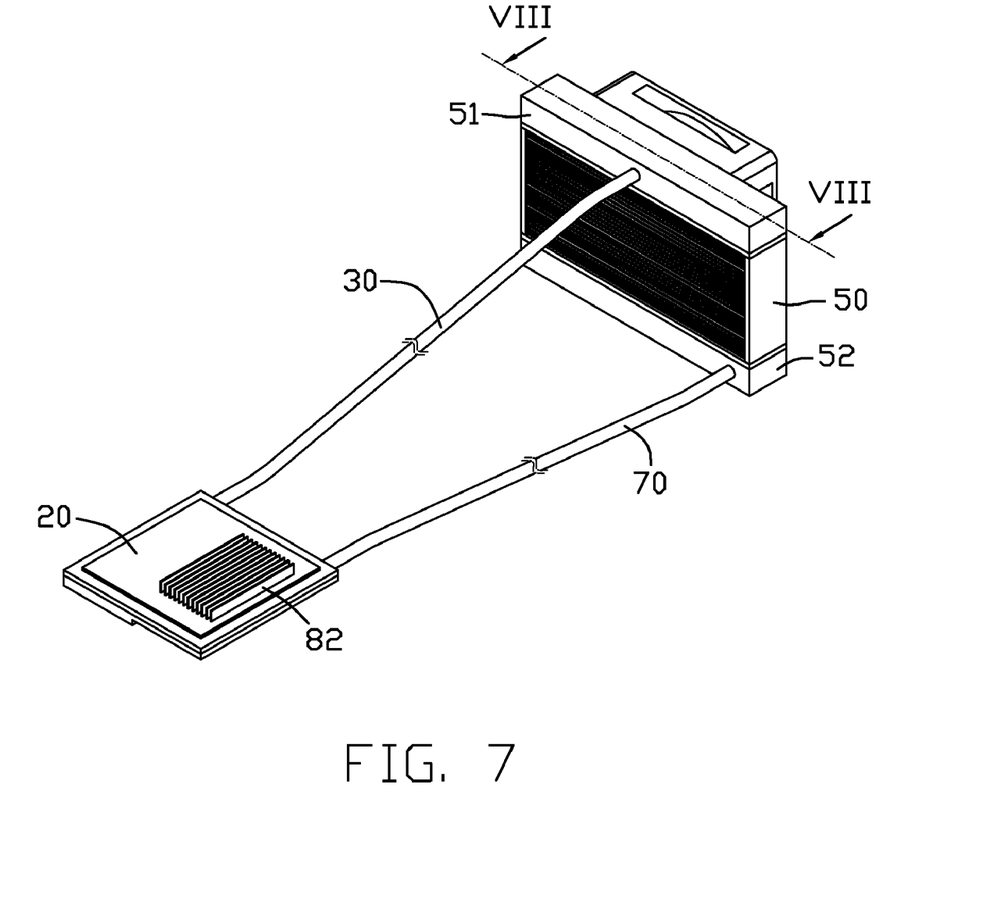
FIG. 7 is an isometric view of a loop-type heat exchange device in accordance with a third embodiment of the present invention.
Figure 8:
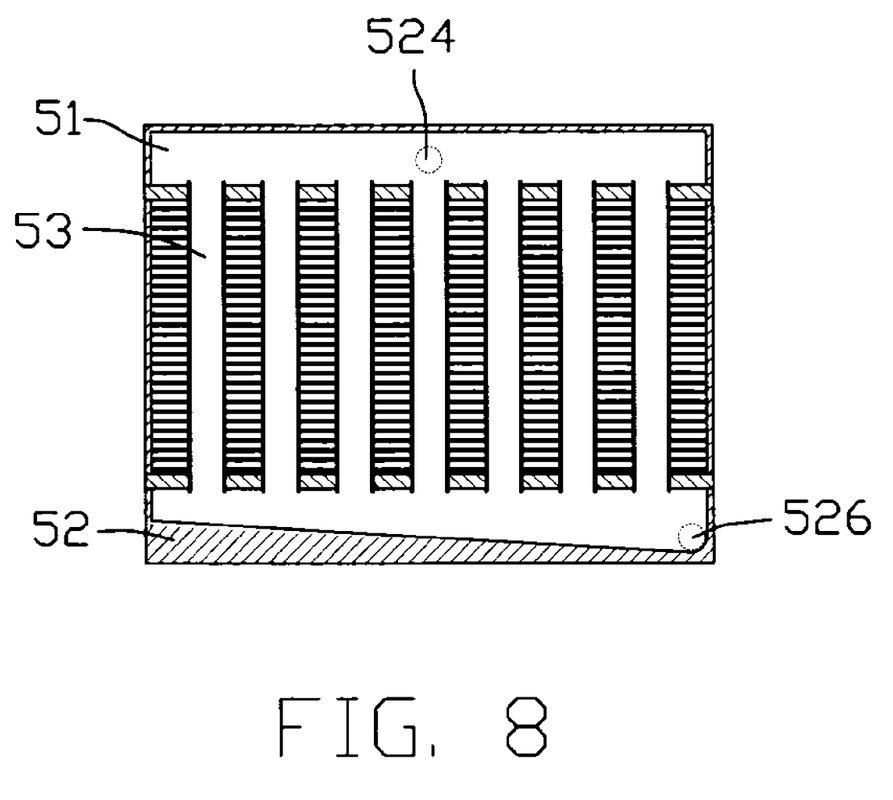
FIG. 8 is a cross-sectional view of a condenser of the loop-type heat exchange device of FIG. 7, taken along line VIII-VIII thereof.

FIGS. 7-8 show a third embodiment of the present invention, in which the vapor and liquid conduits 30, 70 are connected to the top and bottom housings 51, 52 of the condenser 50, respectively. In this embodiment, since the vapor transferred by the vapor conduit 30 enters into the condenser from the top housing 51, the baffle 528 (see FIG. 5) as provided in the bottom housing 52 as required by the first and second embodiments is no longer needed. The other structure of this embodiment is substantially the same as that of the second embodiment described above, and its description is omitted.

Figure 9:
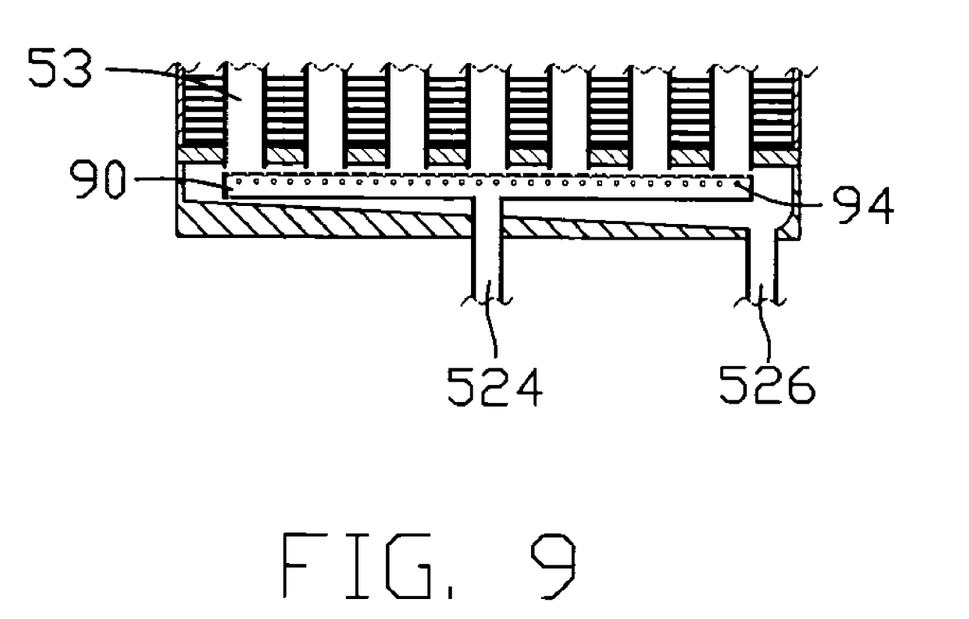
FIG. 9 is a fragmentary, cross-sectional view showing a condenser in accordance with another example.
Figure 10:
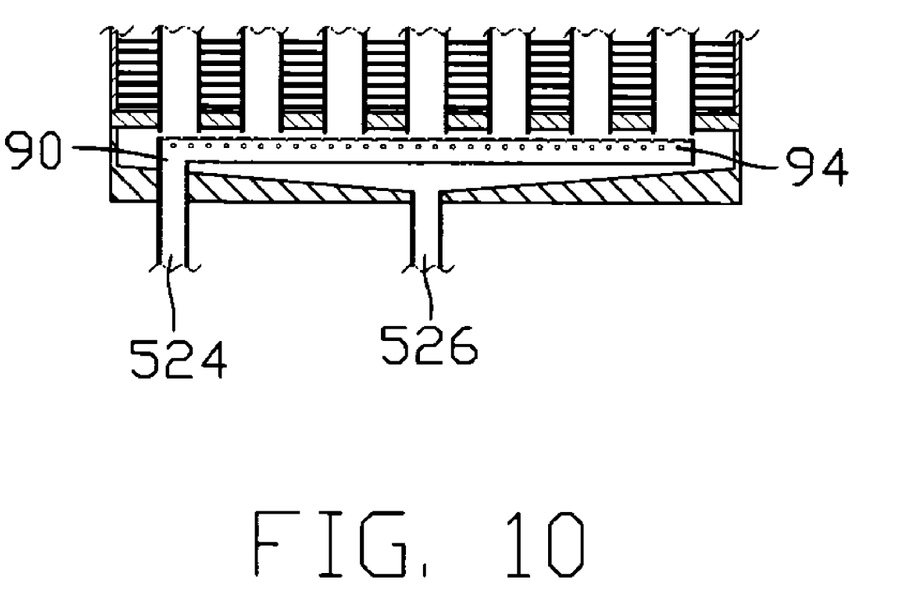
FIG. 10 is a fragmentary, cross-sectional view showing a condenser in accordance with a further example.

Referring now to FIGS. 9-10, in order to further increase the heat exchange capability of the condenser 50, a vapor dispenser 90 is provided in the bottom housing 52 for distributing the vapor entering into the bottom housing 52 over the condensing tubes 53 of the condenser 50 evenly. The inlet 524 of the bottom housing 52 is connected with the vapor dispenser 90. The vapor dispenser 90 is provided with a plurality of openings 94 oriented towards the condensing tubes 53 of the condenser 50 so that the vapor can be uniformly divided by these openings 94 into many small portions for successively entering into these condensing tubes 53. As shown in FIG. 9, the inlet 524 is connected to a middle portion of the vapor dispenser 90. In FIG. 10, the inlet 524 is shown as connected to one end of the vapor dispenser 90 and the outlet 526 of the bottom housing 52 is located at a middle portion of the bottom housing 52. Due to the presence of the vapor dispenser 90, the baffle 528, as shown in FIG. 5, is no longer required. Although in FIGS. 9-10 the vapor dispenser 90 is shown as provided in the bottom housing 52 of the condenser 50, it should be recognized that if the vapor enters into the condenser 50 from the top housing 51 thereof as shown in FIGS. 7-8 of the third embodiment, the vapor dispenser 90 is expected to be provided in the top housing 51.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat exchange device for removing heat from a heat-generating component, comprising:
    an evaporator comprising a top cover and a bottom cover, the top and bottom covers cooperating with each other to define a chamber inside the evaporator, the chamber having a liquid micro-channel region and an adjacent evaporating region, a protrusion being formed on an outer surface of the bottom cover of the evaporator and being located corresponding to a substantially middle portion of the evaporating region of the chamber for contacting said heat-generating component, the liquid micro-channel region being fully filled with a first wick structure, the middle portion of the evaporating region being filled with a second wick structure, the second wick structure being connected to the first wick structure and substantially covering the protrusion of the bottom cover of the evaporator, a remaining part of the evaporating region not filled with the second wick structure being provided as a vapor-gathering sub-region, a working fluid being filled in the chamber, the working fluid turning into vapor in the evaporating region of the evaporator upon receiving heat from said heat-generating component, the generated vapor being accommodated in the vapor-gathering sub-region;
    a condenser including a first housing member, a plurality of tube members being in fluid communication with the first housing member, and a fin member maintained in thermal contact with the tube members; and
    a vapor conduit and a liquid conduit each being connected between the evaporator and the condenser, the vapor conduit being connected to and communicating with the vapor-gathering sub-region to convey the vapor generated in the evaporator to the tube members of the condenser, the vapor turning into condensate in the tube members upon releasing the heat to the fin member, the liquid conduit being connected to and communicating with the liquid micro-channel region to convey the condensate back to the evaporator.

2. The heat exchange device of claim 1, wherein the vapor conduit and liquid conduit both are connected to the first housing member of the condenser.

3. The heat exchange device of claim 2, wherein the first housing member is provided with a baffle located adjacent to the liquid conduit and configured for preventing the vapor transferred to the first housing member by the vapor conduit from entering into the liquid conduit.

4. The heat exchange device of claim 2, wherein a vapor dispenser is provided inside the first housing and the vapor dispenser defines therein a plurality of openings oriented towards the tube members of the condenser.

5. The heat exchange device of claim 1, wherein the condenser further includes a second housing member being in fluid communication with the tube members, and the vapor conduit is connected to the second housing member and the liquid conduit is connected to the first housing member.

6. The heat exchange device of claim 5, wherein the tube members and the fin member are located between the first and second housing members of the condenser.

7. The heat exchange device of claim 5, wherein a vapor dispenser is provided inside the second housing member and the vapor dispenser defines therein a plurality of openings oriented towards the tube members of the condenser.

8. The heat exchange device of claim 1, wherein the fin member includes a plurality of metal fins stacked along the tube members.

9. The heat exchange device of claim 1, wherein the first housing member has a slanted inner surface declining along a direction from the vapor conduit towards the liquid conduit.

10. The heat exchange device of claim 1, wherein a third wick structure is arranged inside the liquid conduit.

11. The heat exchange device of claim 1, wherein the evaporator has a plurality of metal fins extending from an outer surface thereof corresponding to the liquid micro-channel region of the chamber.

12. The heat exchange device of claim 1, wherein the bottom cover of the evaporator has a first section and a second section corresponding to the evaporating region and the liquid micro-channel region of the chamber, respectively, the first section being thicker than the second section.

13. A loop type heat exchanger comprising:
    an evaporator having a protrusion formed on a bottom wall thereof adapted for contacting a heat-generating component, the evaporator defining a chamber therein, the chamber having a liquid micro-channel region and an adjacent evaporating region, the protrusion being located corresponding to a substantially middle portion of the evaporating region of the chamber, the liquid micro-channel region being fully filled with a first wick structure, the middle portion of the evaporating region being filled with a second wick structure, the second wick structure being connected to the first wick structure and substantially covering the protrusion of the bottom cover of the evaporator, a remaining part of the evaporating region not filled with the second wick structure being provided as a vapor-gathering sub-region, a working fluid being saturated in the second wick structure, said working fluid being evaporated into vapor upon receiving heat from the heat-generating component, the generated vapor being accommodated in the vapor-gathering sub-region;
    a vapor conduit having a first end connected to and communicating with the vapor-gathering sub-region of the evaporator and a second end;

a condenser connecting with the second end of the vapor conduit, having a plurality of tubes and a plurality of fins thermally connecting with the tubes, the vapor flowing through the tubes to be condensed into a condensate; and a liquid conduit having a first end connected with the condenser and a second end connected to and communicating with the liquid micro-channel region of the evaporator, the condensate flowing through the liquid conduit to the first wick structure of the evaporator, the liquid conduit being provided with a third wick structure therein, the third wick structure being connected to the first wick structure.

14. The loop type heat exchanger of claim 13, wherein the condenser has a slanted inner surface declining from the vapor conduit toward the liquid conduit, the condensate in the condenser flowing along the slanted inner surface before entering the liquid conduit.

15. The loop type heat exchanger of claim 13, wherein the first end of the vapor conduit and the second end of the liquid conduit are located at the same level, while the second end of the vapor conduit is located at a higher level than the first end of the liquid conduit.

16. The loop type heat exchanger of claim 13, wherein the condenser has a vapor dispenser connecting with the second end of the vapor conduit, and the vapor dispenser has a plurality of holes facing the tubes.

17. The loop type heat exchanger of claim 13, wherein the condenser has a baffle located near the first end of the liquid conduit for preventing the vapor in the condenser from entering the liquid conduit.

18. The loop type heat exchanger of claim 13, wherein the bottom wall of the evaporator has a varied thickness with a portion having a thicker thickness, the protrusion being formed on the portion having the thicker thickness.

19. The heat exchange device of claim 1, wherein the second wick structure has a size substantially equal to that of the protrusion of the bottom cover, and the second wick structure is fittingly located just above the protrusion.

* * * * *